US011094499B1

(12) United States Patent
Chen et al.

(10) Patent No.: US 11,094,499 B1
(45) Date of Patent: Aug. 17, 2021

(54) APPARATUS OF CHARGED-PARTICLE BEAM SUCH AS ELECTRON MICROSCOPE COMPRISING SLIDING SPECIMEN TABLE WITHIN OBJECTIVE LENS

(71) Applicants: Zhongwei Chen, Los Altos Hills, CA (US); Xiaoming Chen, Sunnyvale, CA (US); Daniel Tang, Fremont, CA (US); Liang-Fu Fan, Fremont, CA (US)

(72) Inventors: Zhongwei Chen, Los Altos Hills, CA (US); Xiaoming Chen, Sunnyvale, CA (US); Daniel Tang, Fremont, CA (US); Liang-Fu Fan, Fremont, CA (US)

(73) Assignee: BORRIES PTE. LTD., Singapore (SG)

( * ) Notice: Subject to any disclaimer, the term of this patent is extended or adjusted under 35 U.S.C. 154(b) by 0 days.

(21) Appl. No.: 17/178,249

(22) Filed: Feb. 18, 2021

Related U.S. Application Data

(60) Provisional application No. 63/087,238, filed on Oct. 4, 2020.

(51) Int. Cl.
*H01J 37/20* (2006.01)
*H01J 37/26* (2006.01)

(52) U.S. Cl.
CPC ............... *H01J 37/20* (2013.01); *H01J 37/26* (2013.01); *H01J 2237/202* (2013.01)

(58) Field of Classification Search
USPC ....................................................... 250/491.1
See application file for complete search history.

(56) References Cited

U.S. PATENT DOCUMENTS

| | | | | |
|---|---|---|---|---|
| 4,223,224 A * | 9/1980 | Rauch | H01J 37/20 250/442.11 |
| 4,827,127 A * | 5/1989 | Todokoro | H01J 37/04 250/310 |
| 5,149,967 A * | 9/1992 | Otaka | H01J 37/20 250/310 |
| 7,947,951 B2 * | 5/2011 | Khursheed | H01J 37/28 250/305 |
| 8,164,060 B2 * | 4/2012 | Liu | H01J 37/28 250/310 |
| 9,431,208 B2 * | 8/2016 | Fukutome | H01J 37/20 |
| 10,192,713 B2 * | 1/2019 | Yabata | H01J 37/20 |
| 10,520,527 B2 * | 12/2019 | Pan | H01J 37/244 |

* cited by examiner

*Primary Examiner* — Phillip A Johnston
(74) *Attorney, Agent, or Firm* — Guosheng Wang; United States Research and Patent Firm

(57) ABSTRACT

The present invention provides an apparatus of charged-particle beam such as an electron microscope including a specimen table that can slide on a planar surface around the lower pole piece of the objective lens. The specimen table is confined in a specimen stage having one elastic protrusion and one or more elastic force receiving parts (e.g three permanent protrusions) that contact and press the table. When the specimen is under microscopic examination, disturbing vibration cannot generate a force sufficient to overcome the limiting friction between the specimen table and the planar surface of the objective lens. The invention exhibits numerous technical merits such as minimal or zero vibration noise, and improved image quality, among others.

20 Claims, 14 Drawing Sheets

APPARATUS OF CHARGED-PARTICLE BEAM SUCH AS ELECTRON MICROSCOPE COMPRISING SLIDING SPECIMEN TABLE WITHIN OBJECTIVE LENS

CROSS-REFERENCE TO RELATED U.S. APPLICATIONS

This application claims priority to U.S. Provisional patent Application No. 63/087,238, filed Oct. 4, 2020, entitled "Several Designs for Apparatus of Charged-Particle Beam and Methods Thereof," the entire disclosure of which is hereby incorporated by reference.

STATEMENT REGARDING FEDERALLY SPONSORED RESEARCH OR DEVELOPMENT

Not applicable.

NAMES OF PARTIES TO A JOINT RESEARCH AGREEMENT

Not applicable

REFERENCE TO AN APPENDIX SUBMITTED ON COMPACT DISC

Not applicable.

FIELD OF THE INVENTION

The present invention generally relates to an apparatus of charged-particle beam such as an electron microscope having a stabilized specimen table. More particularly, the electron microscope includes a sliding specimen table within/on the objective lens, such as a sliding specimen table on the lower pole piece of the objective lens. Although the invention will be illustrated, explained and exemplified by a scanning transmission electron microscope (STEM), it should be appreciated that the present invention can also be applied to other electron microscopes, for example, scanning electron microscope (SEM) and transmission electron microscope (TEM).

BACKGROUND OF THE INVENTION

The wavelength of an electron can be up to 100,000 times shorter than that of visible light photons. For example, the De Broglie wavelength of an electron with KE=1 eV and rest mass energy 0.511 MeV is 1.23 nm, about a thousand times smaller than a 1 eV photon. An electron microscope (EM) uses a beam of accelerated electrons as the source of illumination, and it can gain a much higher resolving power than light microscopes. For example, a transmission electron microscope (TEM) can achieve better than 50 pm resolution and magnifications of up to about 10,000,000×. In contrast, most light microscopes are limited by diffraction to about 200 nm resolution and useful magnifications below 2000×. Owing to the small de Broglie wavelength of electrons, TEM and STEM can enable the user to examine fine detail as small as a single column of atoms. Therefore, electron microscopes find application in cancer research, virology, materials science as well as pollution, nanotechnology, and semiconductor research, and they are used to investigate the ultrastructure of a wide range of specimens including tumor cells, microorganisms, large molecules, biopsy samples, semiconductor device, metals, and crystals.

In acquiring a high-quality EM image, the specimen under examination must be motionless relative to the EM objective lens. However, this requirement cannot always be satisfied, and the observed image is thus deteriorated or blurred, due to various disturbances such as vibration and drift. Disturbing or noisy vibration may be attributed to sources such as a working vacuum pump, cooling fans for EM control section and computers, and the floor affected by vibrations transmitted from nearby traffic flow.

U.S. Pat. No. 7,791,043 assigned to Hitachi High-Technologies Corporation discloses a stage system, which attempts to increase the stop stiffness of the stage. The system includes a specimen stage, a specimen table, a base member on which the table is mounted, and a pair of drive units for driving the stage. The table is pinched between the pair of the drive units. The drive unit has an ultrasonic motor for driving the table, a pre-load mechanism for pressing the ultrasonic motor against the table, and a piezoelectric actuator for fixing the table. The piezoelectric actuator is mounted on the pre-load mechanism so as to be movable integrally with the ultrasonic motor. The pre-load mechanism has a positioning member fixed on the base member, a seat member to which the ultrasonic motor and the fixing means are attached, and an elastic member for elastically supporting the seat member on the positioning member. The piezoelectric actuator fixes the table by pressing the table and separates the ultrasonic motor from the table. When the stage is fixed by the piezoelectric actuator after acceleration, deceleration and positioning of the stage performed by the drive mechanism, the piezoelectric actuators positioned on opposite sides of the stage are extended to press the stage.

U.S. Pat. No. 8,581,207 assigned to Korea Basic Science Institute teaches a specimen holder capable of a 3-axis movement for transmission electron microscope (TEM) 3D analysis. The holder rotates cradles for supporting the specimen and moves the cradles back and forth and left and right, and freely changes directions of the specimen. A specimen is mounted in a holder head, and a control part moves the mounted specimen. In the holder head, upper and lower cradles are installed to support the specimen. A rotation gear is installed between the upper and lower cradles to rotate the cradles. A rotation driving gear is welded to the rotation gear to rotate it. A gear cover is movably installed horizontally on the upper portion of the upper cradle. A rack moving gear is welded to a rack gear installed in the gear cover to drive the rack gear, thereby allowing the gear cover to move in perpendicular to a length direction of the head body. In the control part, a cradle rotation means rotates the rotation driving gear. The upper and lower cradles are horizontally moved left and right with an axis gear and an associated driving motor and moved back and forth with a rack and an associated driving motor, or a piezo actuator.

However, the prior art is not satisfactory for at least two reasons. First, the designs are extremely complicated and costly. Second, the vibration/drifting problems of the specimen relative to the objective lens cannot be completely removed. The undesirable vibration may be caused by a vibrating specimen and a stationary objective lens, or by a stationary specimen and a vibrating objective lens, or by a vibrating specimen and a vibrating objective lens, but the two vibrations having different amplitudes and/or different phases. Therefore, there exists a need to overcome the aforementioned defects in the prior art.

Advantageously, the present invention provides an apparatus of charged-particle beam such as an electron microscope comprising a specimen table that, on one hand, can be precisely controlled by the specimen stage for the purpose of scanning, and on the other, can be immune from the influence of unwanted vibration and drifting of the specimen relative to the objective lens. The invention exhibits numerous technical merits such as minimal or zero vibration noise, and improved image quality, among others.

SUMMARY OF THE INVENTION

The present invention provides an apparatus of charged-particle beam such as an electron microscope comprising an objective lens, a specimen table, and a specimen stage having an empty space as a receptacle for accommodating the specimen table. The objective lens has a horizontal planar surface for the specimen table to sit on and slide on. The specimen table can be placed in and removed away from the receptacle. The specimen stage may include one elastic protrusion and one or more elastic force receiving parts (for example, three permanent protrusions) surrounding the empty space. Any three protrusions of said four protrusions are not arranged in a straight line, i.e. they are not arranged in a linear relationship. After the specimen table is placed in the receptacle, the elastic protrusion can push or press the specimen table against the one or more elastic force receiving parts such as all the three permanent protrusions, so as to fix the orientation and the position of the specimen table relative to the specimen stage. The specimen stage can function as an X-Y stage, and move the specimen table by sliding it to a plurality of predetermined positions on the planar surface of the objective lens. Then the specimen stage can hold the specimen table on each of the predetermined positions for a period of examination time. During such a period of examination time, if a disturbing vibration between the objective lens and the specimen stage occurs, at least some of the four protrusions will absorb the vibration to an effect that the specimen table remains stationary relative to the objective lens.

The above features and advantages and other features and advantages of the present invention are readily apparent from the following detailed description of the best modes for carrying out the invention when taken in connection with the accompanying drawings.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements. All the figures are schematic and generally only show parts which are necessary in order to elucidate the invention. For simplicity and clarity of illustration, elements shown in the figures and discussed below have not necessarily been drawn to scale. Well-known structures and devices are shown in simplified form in order to avoid unnecessarily obscuring the present invention. Other parts may be omitted or merely suggested.

DETAILED DESCRIPTION OF THE PREFERRED EMBODIMENT

In the following description, for the purposes of explanation, numerous specific details are set forth in order to provide a thorough understanding of the present invention. It is apparent, however, to one skilled in the art that the present invention may be practiced without these specific details or with an equivalent arrangement.

Where a numerical range is disclosed herein, unless otherwise specified, such range is continuous, inclusive of both the minimum and maximum values of the range as well as every value between such minimum and maximum values. Still further, where a range refers to integers, only the integers from the minimum value to and including the maximum value of such range are included. In addition, where multiple ranges are provided to describe a feature or characteristic, such ranges can be combined.

Figure 1:
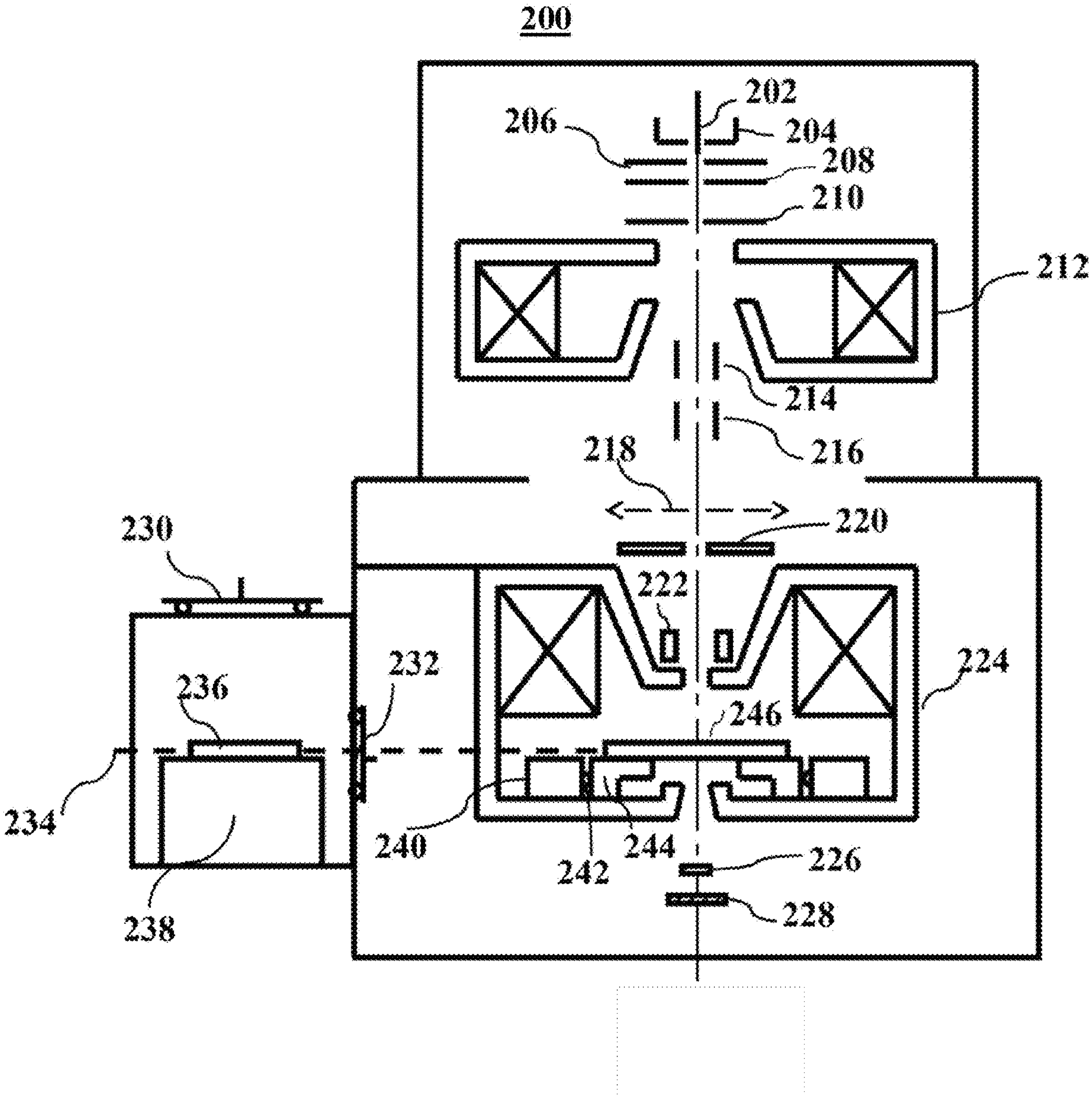
FIG. 1 schematically shows the structure of an apparatus of charged-particle beam such as an electron microscope in accordance with an exemplary embodiment of the present invention.

In an apparatus of charged-particle beam such as an electron microscope, the manipulation of an electron beam is performed using two physical effects. The interaction of electrons with a magnetic field will cause electrons to move according to the left hand rule, thus allowing for electromagnets to manipulate the electron beam. The use of magnetic fields allows for the formation of a magnetic lens of variable focusing power, and the lens shape is determined by the distribution of magnetic flux. Electrostatic fields can cause the electrons to be deflected through a constant angle. Coupling of two deflections in opposing directions with a small intermediate gap allows for the formation of a shift in the beam path. From these two effects, as well as the use of an electron imaging system, sufficient control over the beam path is made possible. The lenses in the beam path can be enabled, tuned, and disabled entirely and simply via rapid electrical switching, the speed of which is only limited by effects such as the magnetic hysteresis. FIG. 1 shows a representative example of an electron microscope. For an skilled person in the art, many of the components in FIG. 1 are well-known, for example, electron beam source 202 such as a tungsten filament or a lanthanum hexaboride ($LaB_6$), suppressor electrode 204, beam extractor 206, anode 208, gun aperture 210, condenser lens 212 that is responsible for primary beam formation, beam blanker 214, stigmator 216 for the correction of asymmetrical beam distortions, objective aperture 218, SEM up detector 220, deflector 222, bright field detector 226, dark field detector 228. A system for the insertion into, motion within, and removal of specimens from the beam path is also needed. The system may include load lock 230, chamber interlock 232, lock port 234, loading and unloading mechanism 236, and transfer table 238. Other parts in the microscope may be omitted or merely suggested.

Figure 2:
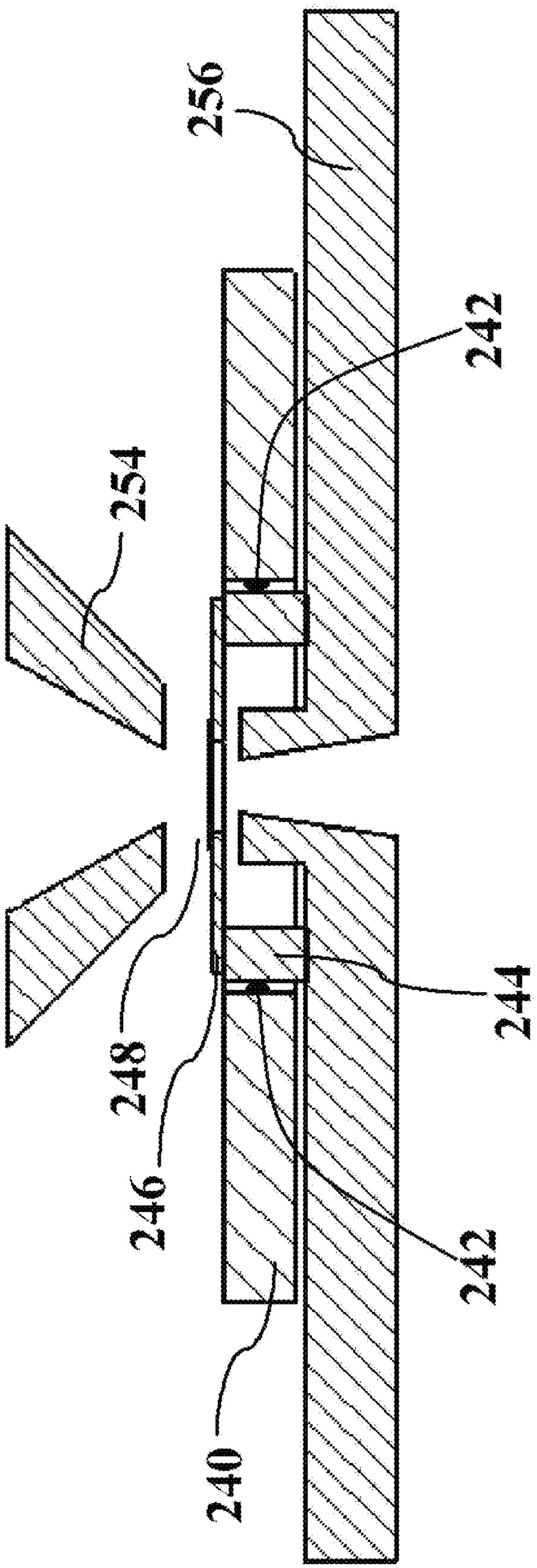
FIG. 2 illustrates the local structure around the specimen table in an electron microscope in accordance with an exemplary embodiment of the present invention.

FIG. 2 only show some parts of FIG. 1 that are necessary in order to elucidate the invention. These parts include an objective lens 224, specimen stage 240, sliding specimen table 244, specimen holder 246, and specimen 248. An elastic protrusion and one or more elastic force receiving parts of the specimen stage 240, such as small convex or protrusions 242, in FIG. 1 are also necessary in order to elucidate the invention.

Although electron lenses may operate electrostatically or magnetically, the majority of electron lenses use electromagnetic coils to generate a convex lens. The field produced for the lens must be radially symmetrical, as deviation from the radial symmetry of the magnetic lens causes aberrations such as astigmatism, and worsens spherical and chromatic aberration. A quadrupole lens is an arrangement of electromagnetic coils at the vertices of the square, enabling the generation of a lensing magnetic fields, the hexapole configuration simply enhances the lens symmetry by using six, rather than four coils Electron lenses may be manufactured from iron, iron-cobalt or nickel cobalt alloys, such as permalloy, due to their good magnetic properties, such as magnetic saturation, hysteresis and permeability. It should be appreciated that the objective lens 224 may be an electromagnetic lens or an electrostatic lens.

Objective lens 224 allows for electron beam convergence, with the angle of convergence as a variable parameter. The magnification may be simply changed by modifying the amount of current that flows through the coil of lenses. Lens 224 may include the yoke, the magnetic coil, the poles, the pole piece, and the external control circuitry. As shown in FIG. 1, electromagnetic lens 224 includes an upper pole piece 254 and a lower pole piece 256. The pole piece must be manufactured in a very symmetrical manner, as this provides the boundary conditions for the magnetic field that forms the lens. Imperfections in the manufacture of the pole piece can induce severe distortions in the magnetic field symmetry, which induce distortions that will ultimately limit the lenses' ability to reproduce the object plane. The exact dimensions of the gap, pole piece internal diameter and taper, as well as the overall design of the lens is often performed by finite element analysis of the magnetic field, taking into account of the thermal and electrical constraints of the design.

The coils which produce the magnetic field are located within the lens yoke. The coils can contain a variable current, but typically utilize high voltages, and therefore require significant insulation in order to prevent short-circuiting the lens components Thermal distributors are placed to ensure the extraction of the heat generated by the energy lost to resistance of the coil windings. The windings may be water-cooled, using a chilled water supply in order to facilitate the removal of the high thermal duty.

The specimen stage 240 includes an empty space as a receptacle for accommodating the specimen table 244. There is a horizontal planar surface around lower pole piece 256, and the specimen table 244 can sit on, and slide on, the planar surface. The specimen stage 240 can move the specimen table 244 by sliding it to a plurality of predetermined positions on the horizontal planar surface, and to hold the specimen table 244 on each of the predetermined positions for a period of examination time. When a disturbing vibration between the objective lens 224 and the specimen stage 244 occurs during the period of examination time, the vibration will be absorbed or dampened to an effect that the specimen table 244 remains stationary relative to the objective lens 224 during the period of examination time. In other words, an ensuing vibration of noise level about each of the predetermined positions will not be generated between the objective lens 224 and the specimen table 244 during the period of examination time.

In a typical embodiment, specimen stage 240 can move specimen table 244 by sliding the table on the horizontal planar surface around lower pole piece 256 from one observation point to the next one. For example, the sliding distance between two adjacent observation points may be greater than 1 μm, preferably greater than 5 or 10 μm. Once specimen table 244 arrives at the observation point, it will stay stationary on the observation point, until it is moved again by stage 240 to the next observation point. At each observation point, however, the disturbing vibration of the stage 240 cannot transmit to the specimen table. For example, the vibration may have an amplitude of less than 2 nm, such as less than 1 nm.

Figure 3:
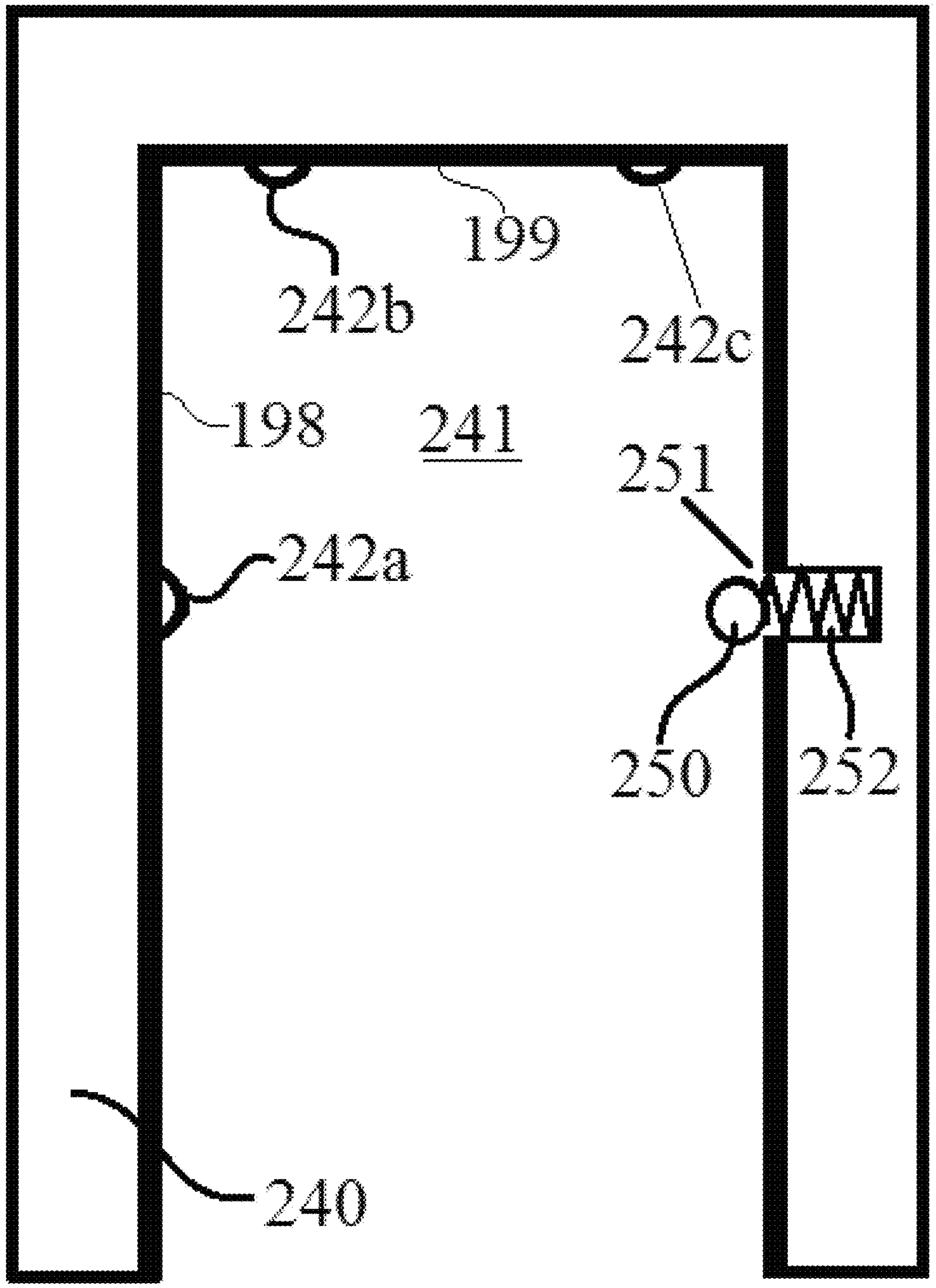
FIG. 3 is the top view of a table receptacle in a specimen stage in accordance with an exemplary embodiment of the present invention.

Referring to FIG. 3, the specimen stage 240 has an empty space as a receptacle 241 for accommodating the specimen table 244. In operation, specimen table 244 can be placed in and removed away from the receptacle 241. The specimen stage 240 may include an elastic protrusion 252 and one or more elastic force receiving parts, for example the side wall 198 opposite to the elastic protrusion 252, the side wall 199 neighboring the elastic protrusion 252, and/or protrusion(s) on the side walls 198 and/or 199, such as three permanent protrusions 242*a*, 242*b* and 242*c*, that are surrounding the empty space of receptacle 241. Permanent protrusions 242*a*, 242*b* and 242*c* may be dome-shaped as shown in FIG. 3 and may be made of a non-magnetic material such as ceramic material, non-ferrous metals such as aluminum, copper, lead, nickel, tin, titanium and zinc, and non-ferrous alloys such as Beryllium Copper (BeCu). An embodiment of elastic protrusion 251 includes a ball 250 attached to a spring 252. Depending on the force against ball 250, the ball can extend more or less into the empty space of receptacle 241 to press or push specimen table 244. Ball 250 may also be made of a non-magnetic material such as ceramic material, non-ferrous metals such as aluminum, copper, lead, nickel, tin, titanium and zinc, and non-ferrous alloys such as Beryllium Copper (BeCu). Any three protrusions of the four protrusions (242*a*, 242*b*, 242*c* and 251) are not in a linear relationship. As will be described in more details, the elastic protrusion 251 can push/press the specimen table 244 against all the three permanent protrusions 242*a*, 242*b* and 242*c* after the specimen table 244 is placed in the receptacle 241, so that the orientation and the position of the specimen table 244 relative to the specimen stage 240 is fixed. By 'fixed", it intends to mean that a disturbing vibration between 240 and 244 is ignored. As will be described later, in the presence of such vibration, the orientation and the position of the specimen table 244 is not absolutely fixed relative to the specimen stage 240.

Figure 4:
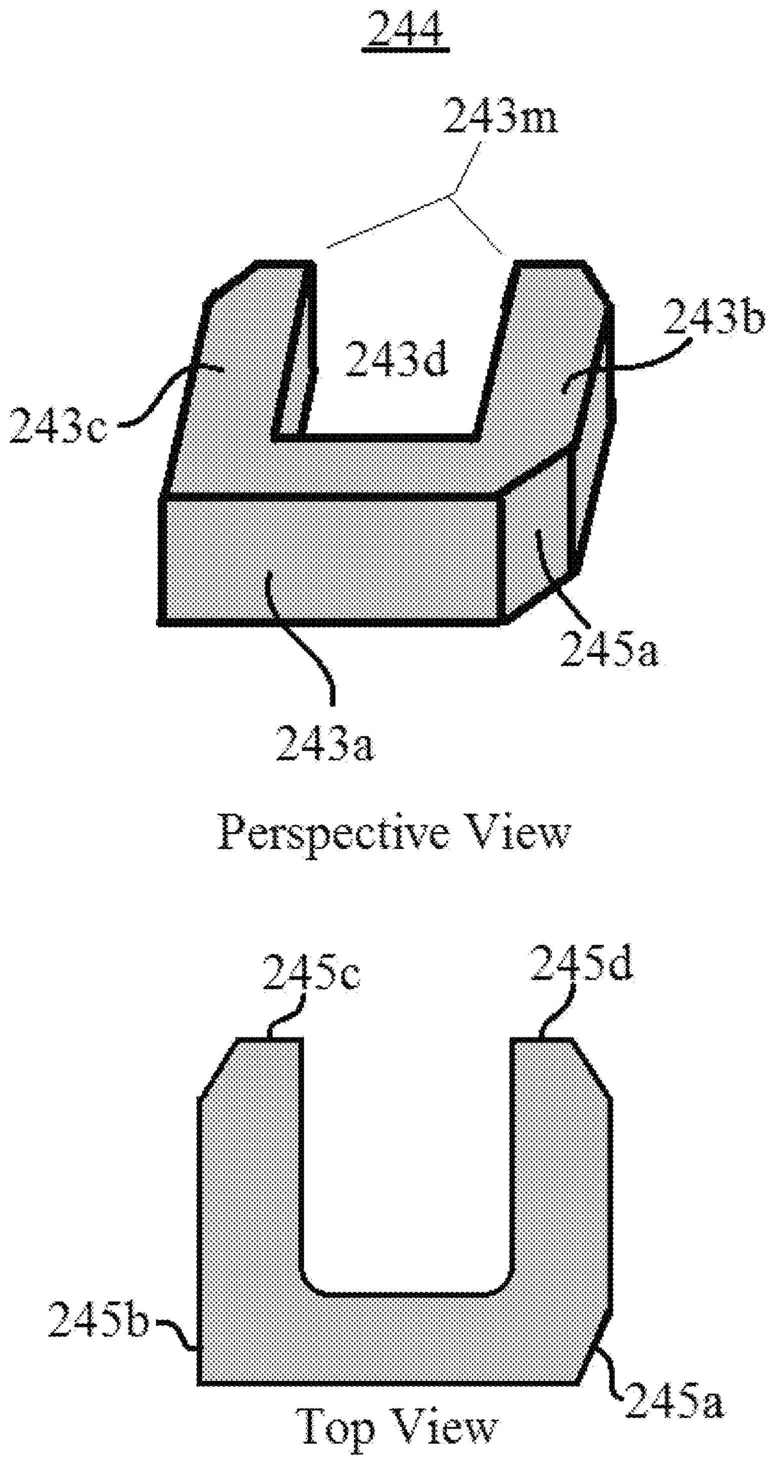
FIG. 4 demonstrates the perceptive view and top view of a specimen table in accordance with an exemplary embodiment of the present invention.

Referring to FIG. 4, the specimen table 244 may be U-shaped, and may include a base 243*a*, a right arm 243*b* and a left arm 243*c* that are extended from the base 243*a*. An open space 243*d* is thus formed by the base 243*a* and the two arms 243*b* and 243*c*. The open space 243*d* has a mouth 243*m*. An electron beam can pass through specimen 248, and then pass through the open space 243*d* in a transmission electron microscope. The specimen table 244 may include four side zones (245*a*, 245*b*, 245*c* and 245*d*) for contacting the four protrusions (242*a*, 242*b*, 242*c* and 251) in specimen stage 240. At least two of the side zones (245*a*, 245*b*, 245*c* and 245*d*) are flat or planar to prevent rotation of the specimen table 244 inside receptacle 241. For example, two, three or all of the side zones are flat. Any three of the four side zones are not parallel to each other, to prevent drifting of the specimen table 244 inside receptacle 241. Two side zones within a same plane are viewed as a special case of "parallel relationship". For example, zones 245*c* and 245*d* may be within the same plane and they are viewed as "parallel to each other". Zone 245*b* is perpendicular to zones 245*c* and 245*d*. Side zone 245*a* is not in parallel with, or perpendicular to, any other side zone (245*b*, 245*c* or 245*d*).

In some embodiments, one end or both ends of right arm 243*b* and left arm 243*c* that are distal from the base 243*a* may be tapered for facilitating the entry of the specimen table 244 into the receptacle 241. For example, the elastic protrusion 251 and front permanent protrusion 242*a* can function as a flexible gate structure to admit the specimen table 244 into the receptacle 241. The specimen table 244 can thus be "snapped into", and temporarily locked in, the receptacle 241. The end of the base 243*a* that is distal from the arms 243*b* and 243*c* may also be tapered for facilitating the retreat of the specimen table 244 from the receptacle 241. Side zone 245*a* may also function as the tapered end for facilitating the retreat of the specimen table 244.

Figure 5:
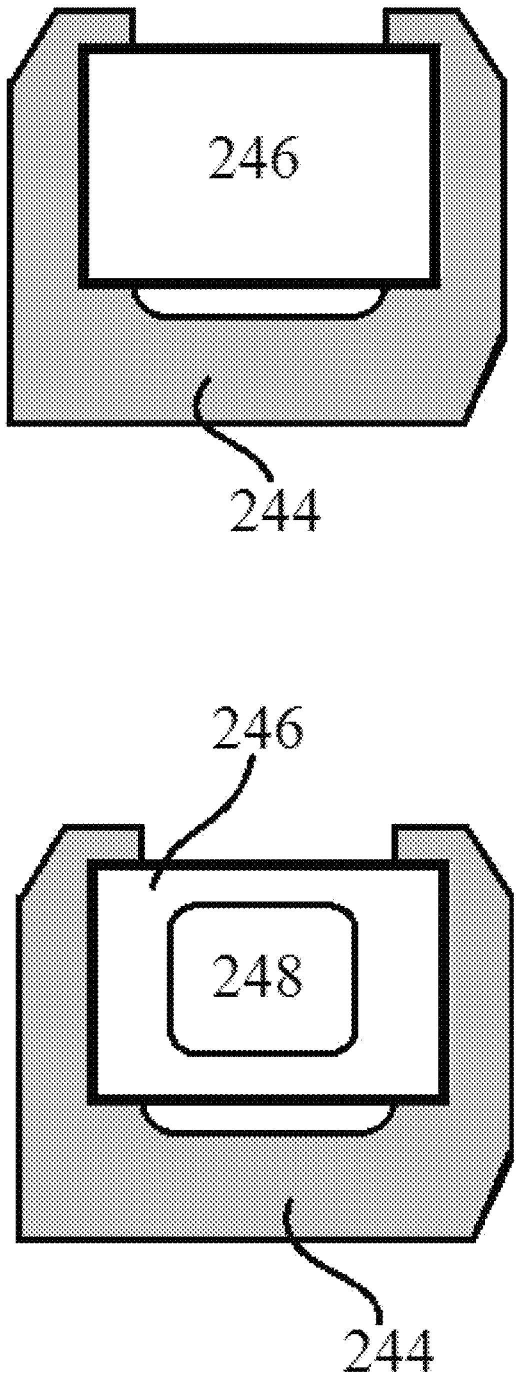
FIG. 5 depicts a piece of specimen and its holder are placed over a specimen table in accordance with an exemplary embodiment of the present invention.

Referring to FIG. 5, a specimen holder 246 can be placed on the specimen table 244 and spanned over open space 243*d*. A specimen or a sample 248 can be placed on specimen holder 246 for microscope examination. Since specimen holder 246 and specimen 248 are stationary relative to specimen table 244, they will be stationary relative to the objective lens 224 during the period of examination time as well.

Figure 6:
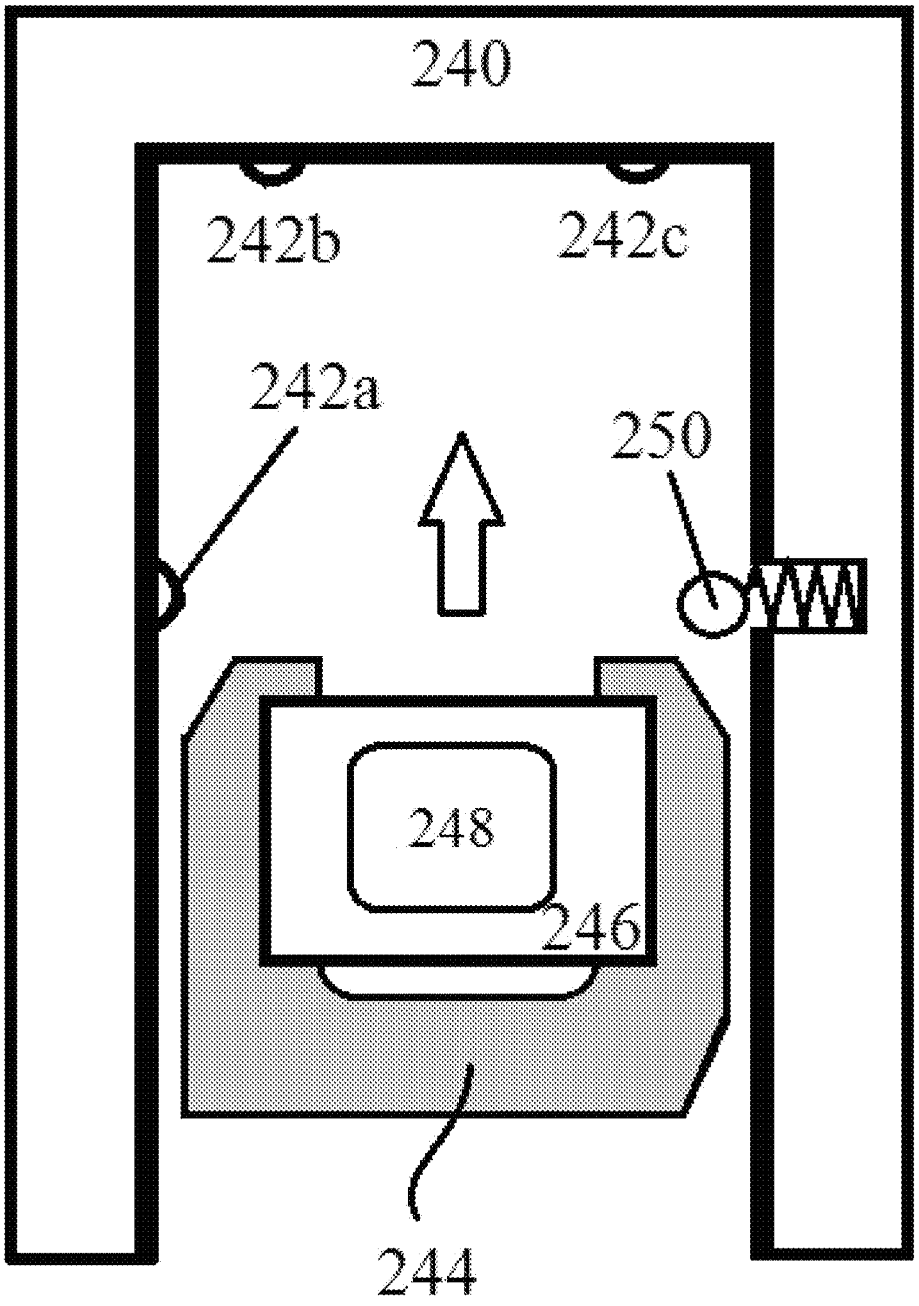
FIG. 6 schematically shows that a specimen table is to enter the receptacle of a specimen stage in accordance with an exemplary embodiment of the present invention.
Figure 7:
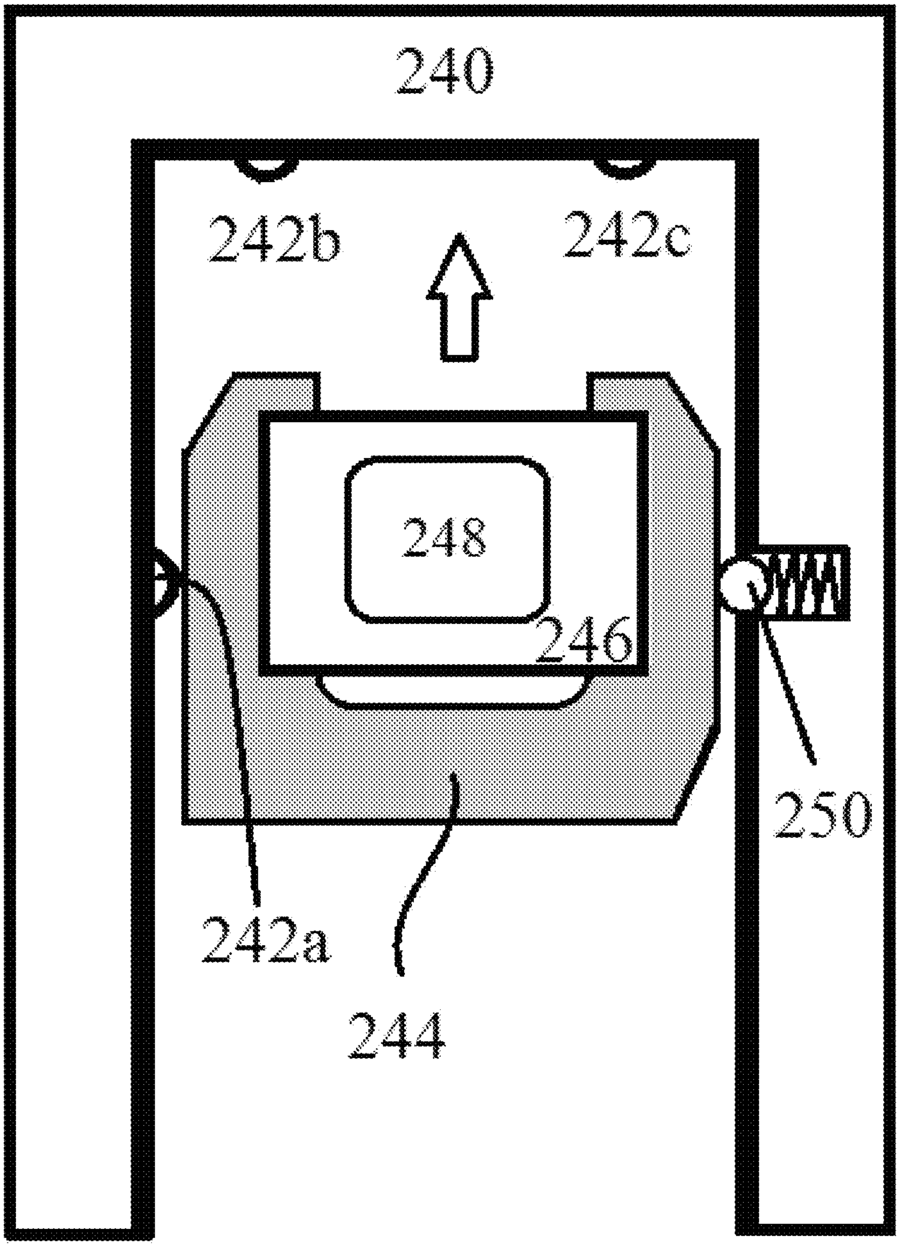
FIG. 7 schematically shows that a specimen table is entering the receptacle of a specimen stage in accordance with an exemplary embodiment of the present invention.
Figure 8:
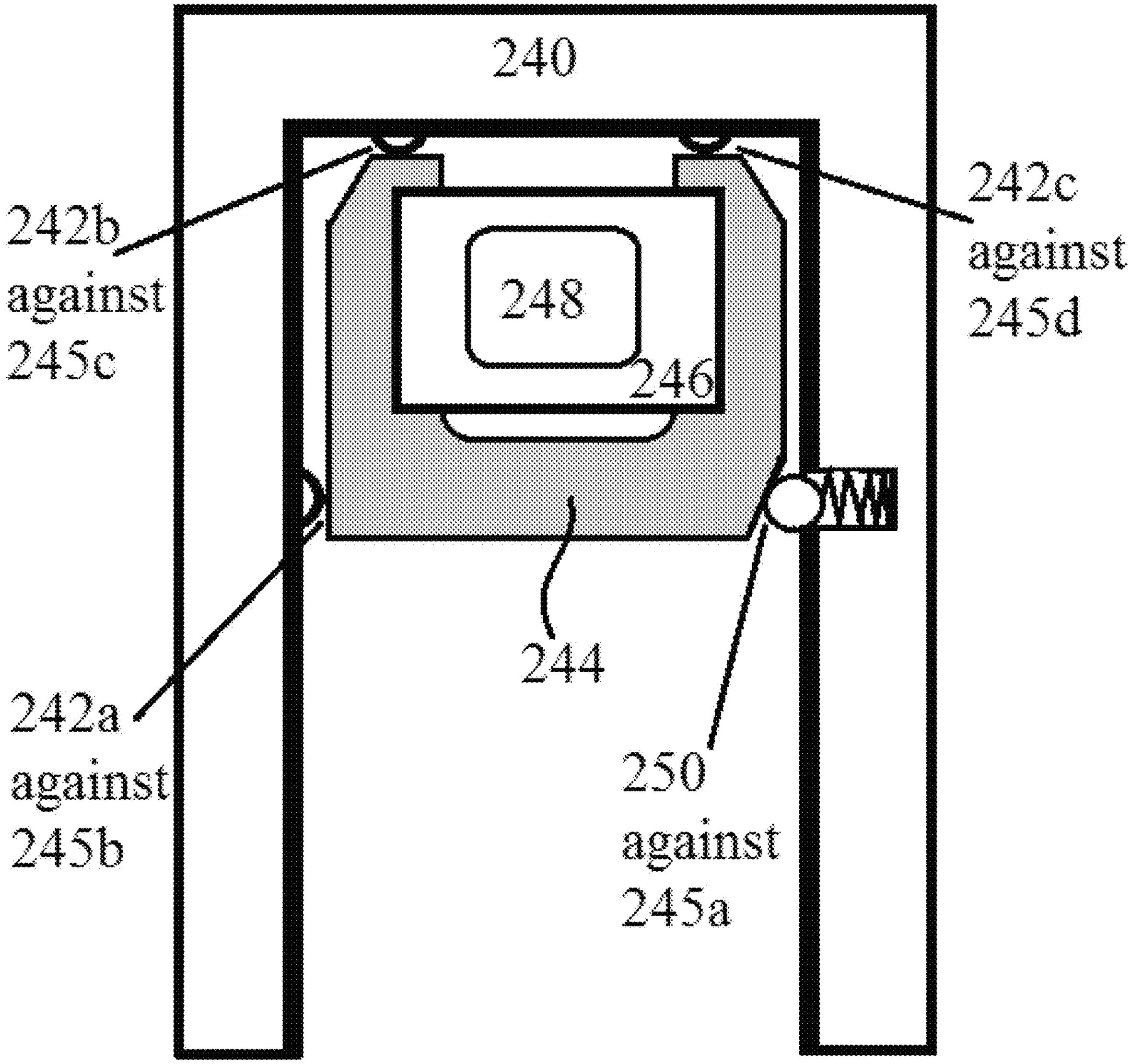
FIG. 8 shows that a specimen table has entered the receptacle of a specimen stage in accordance with an exemplary embodiment of the present invention.

Referring to FIGS. 6-8, after specimen table 244 is loaded with specimen holder 246 and specimen 248, it can be gradually pushed into the receptacle 241 of a specimen stage 240.

Figure 9:
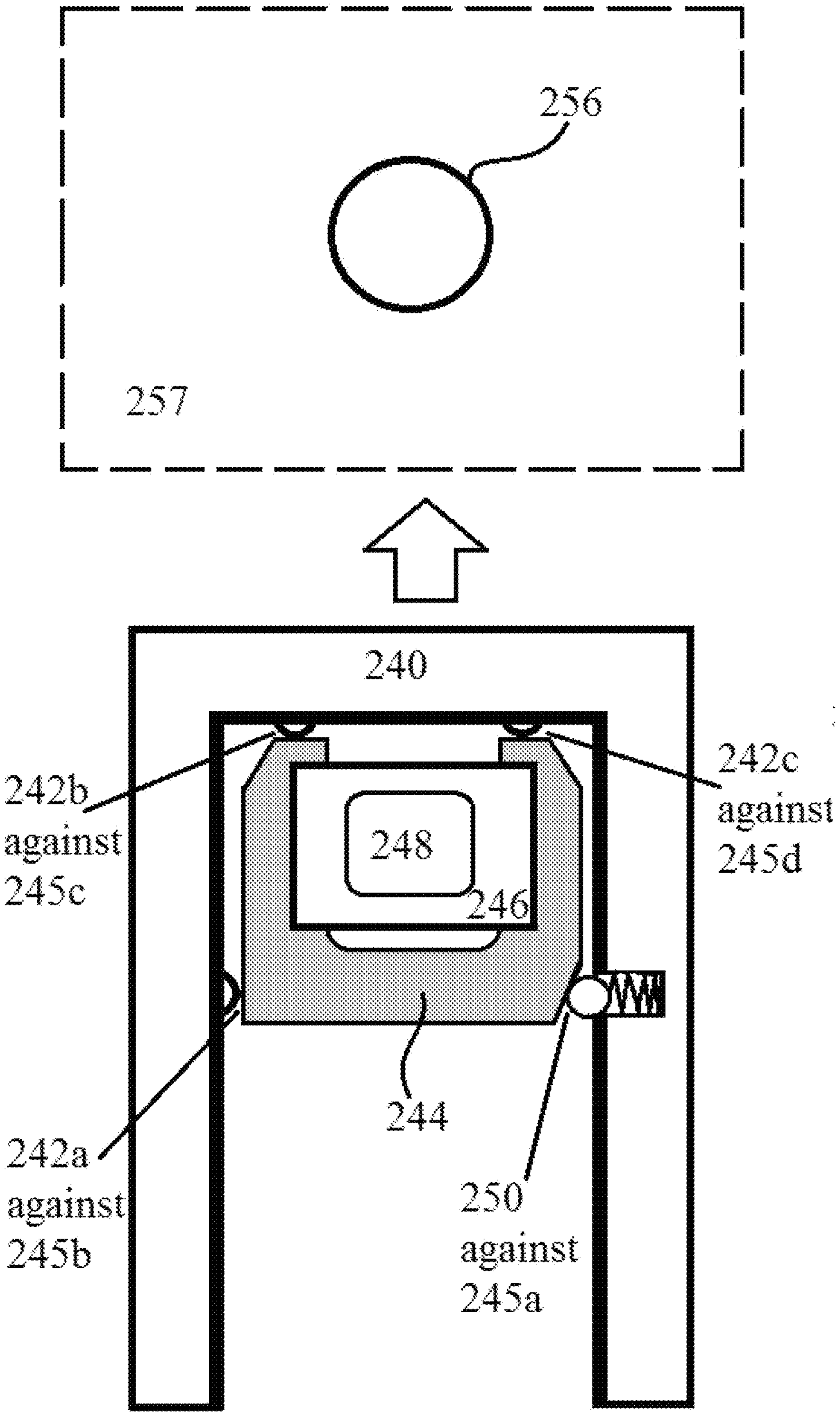
FIG. 9 illustrates that a specimen table is moved to a horizontal planar surface around the lower pole piece of the objective lens in accordance with an exemplary embodiment of the present invention.

Referring to FIGS. 9 and 1, the objective lens 224 has a horizontal planar surface 257 around lower pole piece 256 for the specimen table 244 to sit on and slide on Specimen stage 240, loaded with specimen table 244, specimen holder 246 and specimen 248, can be gradually pushed onto horizontal planar surface 257. The open space 243*d* has a mouth 243*m*, and lower pole piece 256 can enter open space 243*d* through mouth 243*m*. Therefore, lower pole piece 256 does not hinder the movement of specimen table 244.

Figure 10:
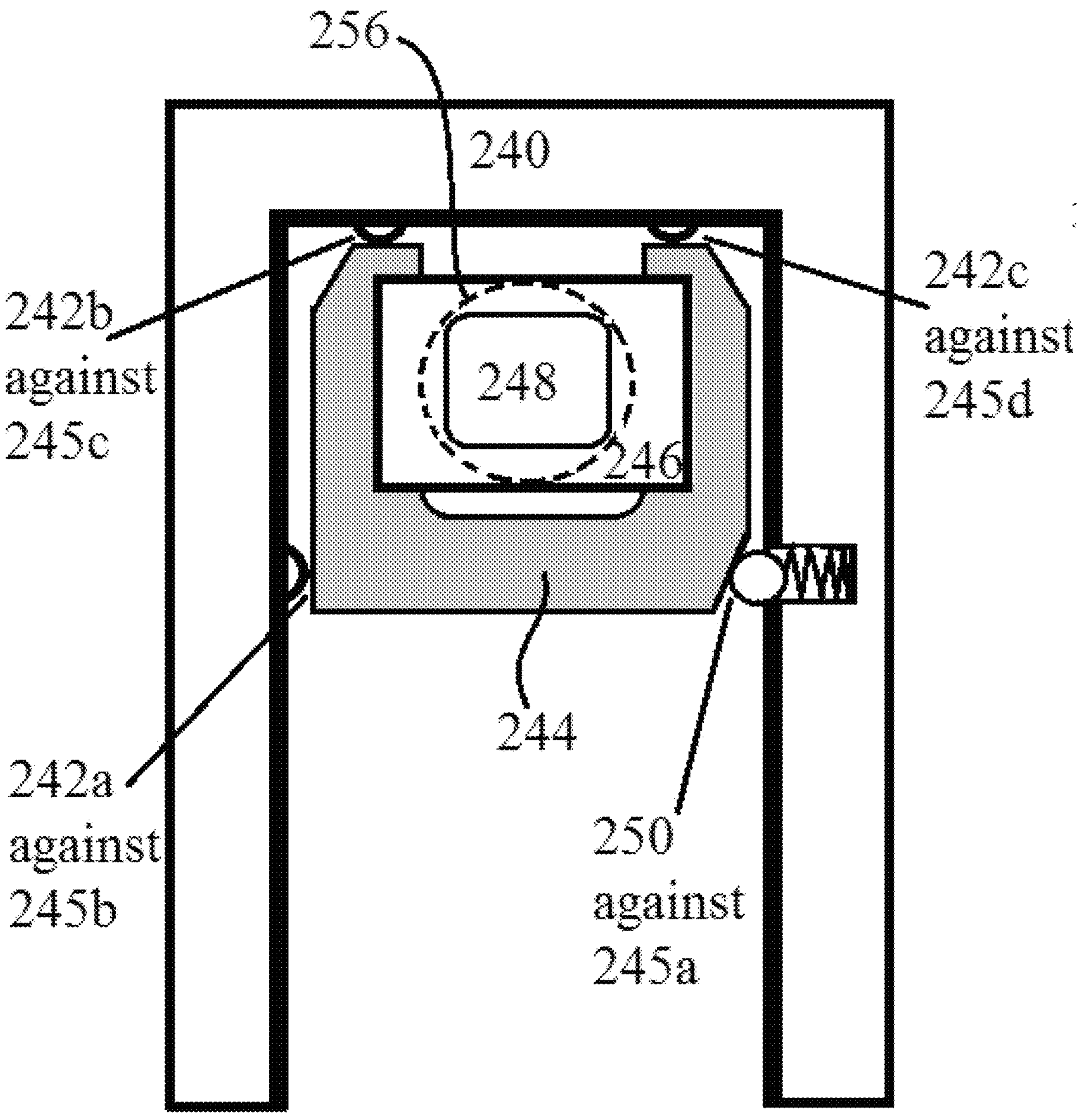
FIG. 10 demonstrates that the specimen is placed over the lower pole in accordance with an exemplary embodiment of the present invention.

Referring to FIG. 10, the specimen 248 is placed over, and aligned with, the lower pole piece 256, ready for microscopic measurement. Referring back to FIG. 1, a beam of electrons is transmitted through an ultra-thin specimen 248, interacting with the specimen as it passes through it. An image is formed from the interaction of the electrons transmitted through the specimen. The image is magnified and focused onto an imaging device, such as a fluorescent screen, on a layer of photographic film, or to be detected by a sensor such as a charge-coupled device.

Figure 11:
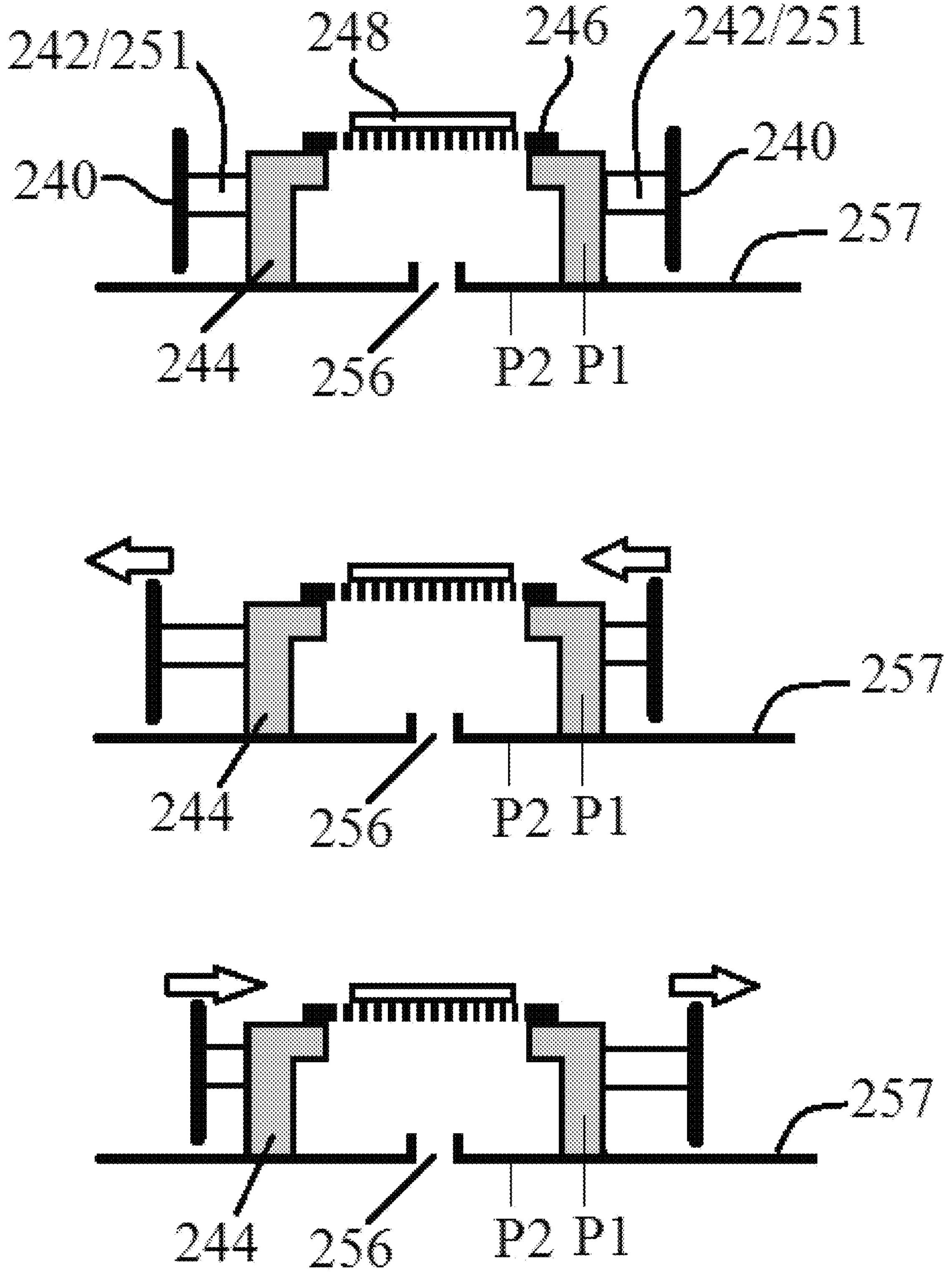
FIG. 11 depicts that, at a first predetermined position, a vibrating specimen stage cannot overcome the static friction between the specimen table and a planar surface of the objective lens, and therefore the specimen table remains stationary to the objective lens, in accordance with an exemplary embodiment of the present invention.

Referring to FIG. 11, when a disturbing vibration (represented by the arrows) between the objective lens 224 and the specimen stage 244 occurs during the period of microscopic examination time, at least some of the four protrusions (242*a*, 242*b*, 242*c* and 251) will absorb or dampen the vibration to an effect that the specimen table 244 remains stationary relative to the objective lens 224 during the period of examination time. In other words, an ensuing vibration is not generated between the objective lens 224 and the specimen table 244 on each of the predetermined positions during said period of examination time. The disturbing vibration may be a mechanical oscillation that occurs about one of the predetermined positions P1 as the equilibrium point. The vibration may be caused by the specimen stage 240 that vibrates relative to a stationary objective lens 224, or caused by the objective lens 224 that vibrates relative to a stationary specimen stage 240. The vibration may be caused by a vibrating specimen stage 240 and an objective lens 224, but the two vibrations have different amplitudes and/or different phases.

When the specimen stage 240 vibrates relative to the objective lens 224, one or more of the four protrusions will be deformed or compressed, and an elastic force of equal magnitude and opposite direction is generated from the deformation or compression of the protrusions. The force is applied to the specimen table 244. However, the vibration has a small amplitude of less than 2 nm, such as less than 1 nm, and the deformation or compression of the protrusions is also in the same magnitude. As a result, the generated force is not strong enough to overcome the static friction between the specimen table 244 and the planar surface 257 of the objective lens 224. The disturbing vibration of the stage 240 cannot transmit to the specimen table 244. In other words, the specimen stage 240 cannot overcome the static friction between the specimen table 244 on the predetermined position P1 and the planar surface 257 of the objective lens 224, so that an ensuing vibration between the objective lens 224 and the specimen table 244 cannot be generated. The specimen table 244 on the predetermined position P1 remains stationary relative to the objective lens 224.

Figure 12:
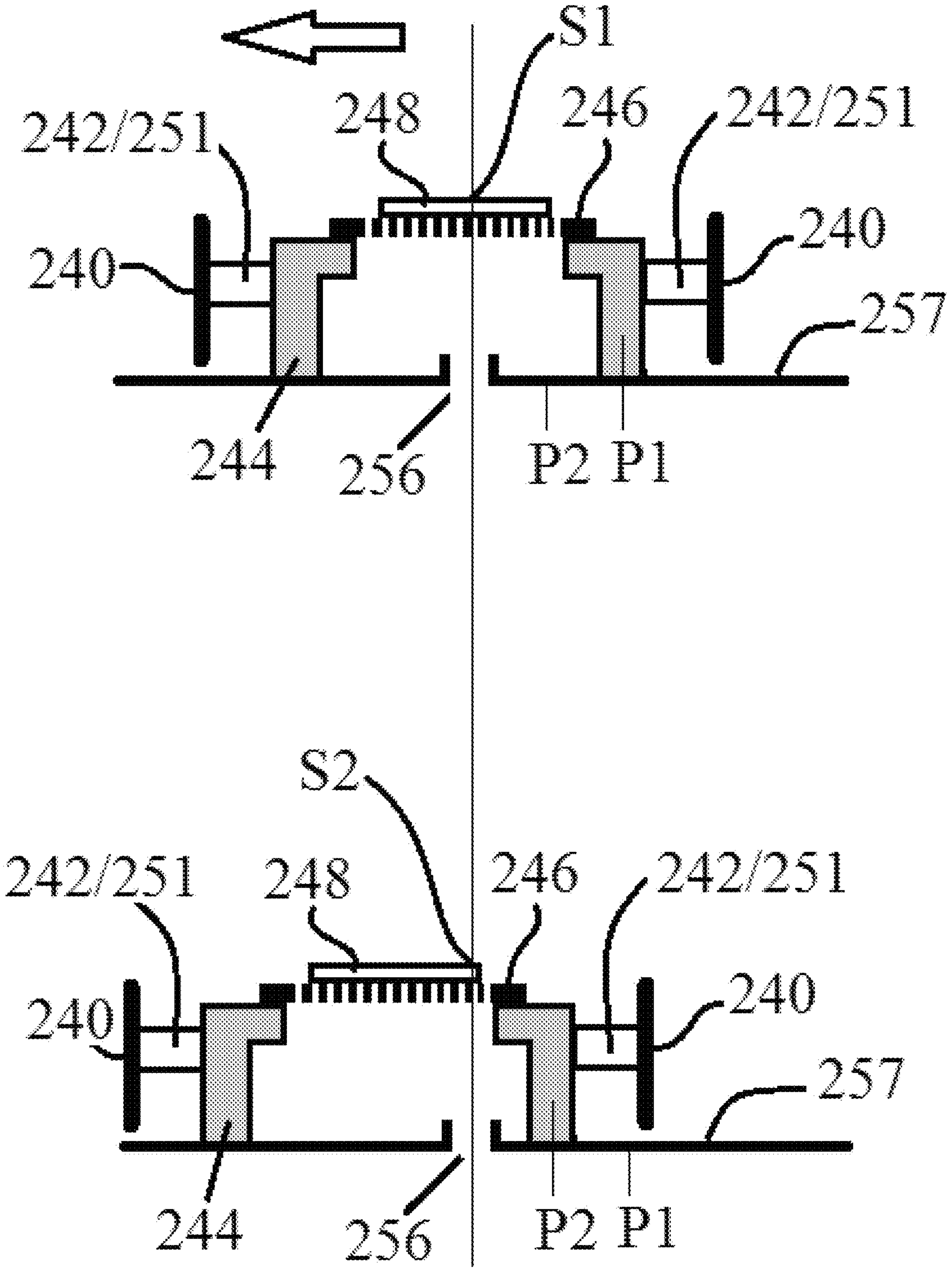
FIG. 12 schematically shows that a moving specimen stage can overcome the static friction between the specimen table and a planar surface of the objective lens, and it can therefore move the specimen table from the first predetermined position to a second predetermined position, in accordance with an exemplary embodiment of the present invention.

After the measurement on positon P1 is completed, the specimen table 244 can slide on the planar surface 257 from position P1 to another predetermined position P2. A predetermined position may be corresponding to an observation point S of the specimen. As shown in FIG. 12, the predetermined positions P1 and P2 on the planar surface 257 of the objective lens 224 are corresponding to observation point S1 and S2 of the specimen 248, respectively. Since the sliding distance between P1 and P2 (or S1 and S2) is greater than 1 which is more than 1000 times longer than the disturbing vibration amplitude (<1 nm level), the elastic force generated from the deformation or compression of the protrusions will be much greater than the static friction force between the specimen table 244 and the planar surface 257. The specimen stage 240 can overcome the static (let alone kinetic) friction between the specimen table 244 and the planar surface 257 of the objective lens 224. As a result, the specimen stage 240 forces the specimen table 244 to slide on the planar surface 257 from a predetermined position P1 to another P2.

Figure 13:
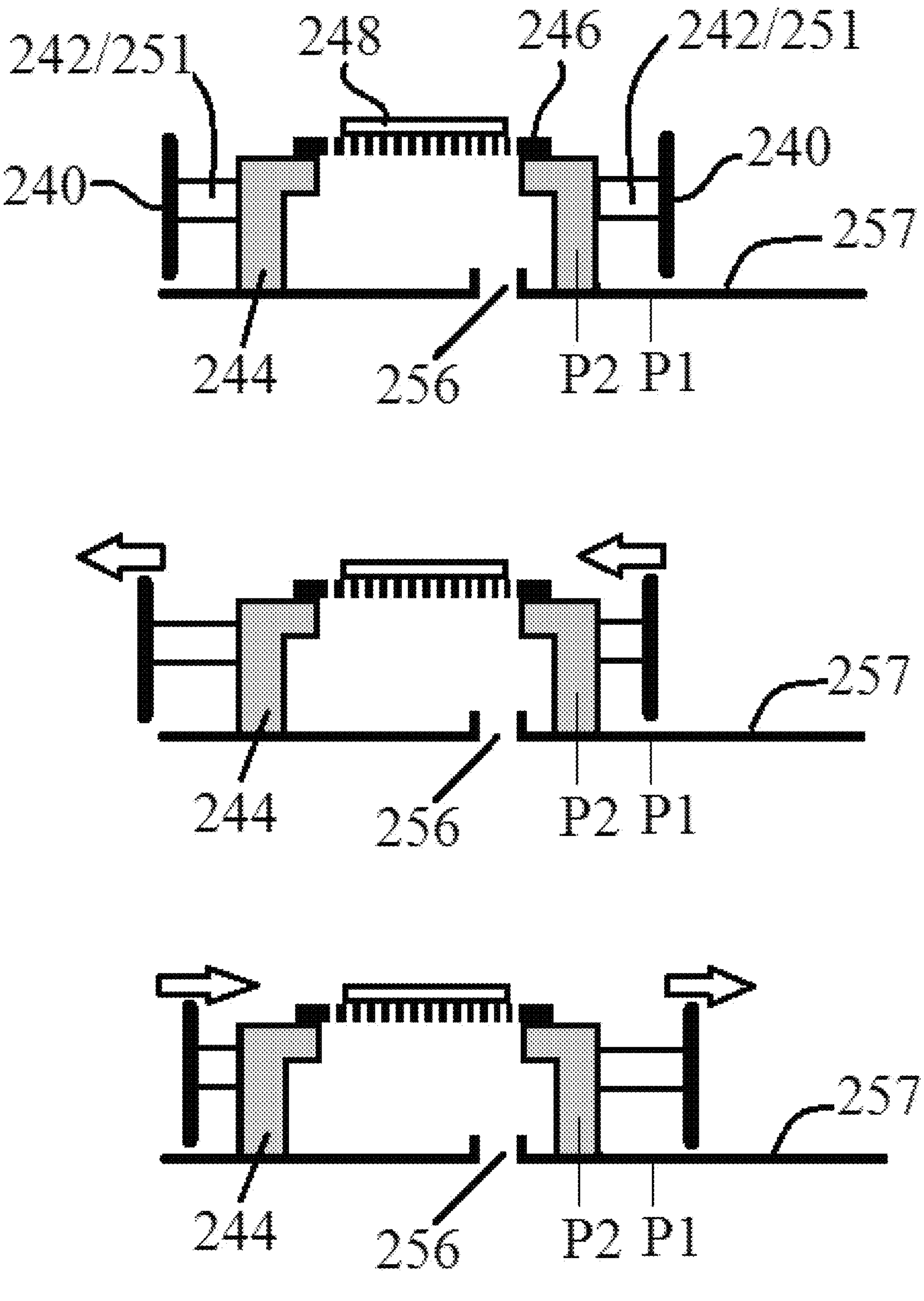
FIG. 13 illustrates that, at the second predetermined position, a vibrating specimen stage cannot overcome the static friction between the specimen table and a planar surface of the objective lens, and therefore the specimen table remains stationary to the objective lens, in accordance with an exemplary embodiment of the present invention.

Like FIG. 11, FIG. 13 shows that the vibration occurs about a new predetermined positions P2 as the equilibrium point. Again, the specimen stage 240 cannot overcome the static friction between the specimen table 244 on the predetermined position P2 and the planar surface 257 of the objective lens 224, so that an ensuing vibration between the objective lens 224 and the specimen table 244 cannot be generated. The specimen table 244 on the predetermined position P2 remains stationary relative to the objective lens 224, until it is forced to slide to another predetermined point.

The aforementioned "static friction" is defined as friction between two solid objects that are not moving relative to each other. For example, static friction can prevent an object from sliding down a sloped surface. The static friction force must be overcome by an applied force before an object can move. The maximum value of static friction, when motion is impending, is referred to as limiting friction. In the present invention, disturbing vibration and drift generates a force that is lower than the limiting friction between the specimen table 244 and the planar surface 257 of the objective lens 224.

When sliding occurs, static friction is no longer applicable, the friction between the two surfaces is then called kinetic friction, dynamic friction or sliding friction. Kinetic friction occurs when two objects are moving relative to each other and rub together (like a sled on the ground). The coefficient of static friction is generally higher than the coefficient of kinetic friction.

According to the present invention, the limiting friction between the specimen table 244 and the planar surface 257 of the objective lens 224 can be adjusted and made suitable for any apparatus of charged-particle beam such as an electron microscope. The following variable factors can be used for the purpose of tuning the limiting friction the weight of specimen table 244, the size of specimen table 244's bottom surface that contacts planar surface 257, the surface properties of specimen table 244's bottom surface, and the surface properties of planar surface 257, among others.

Figure 14:
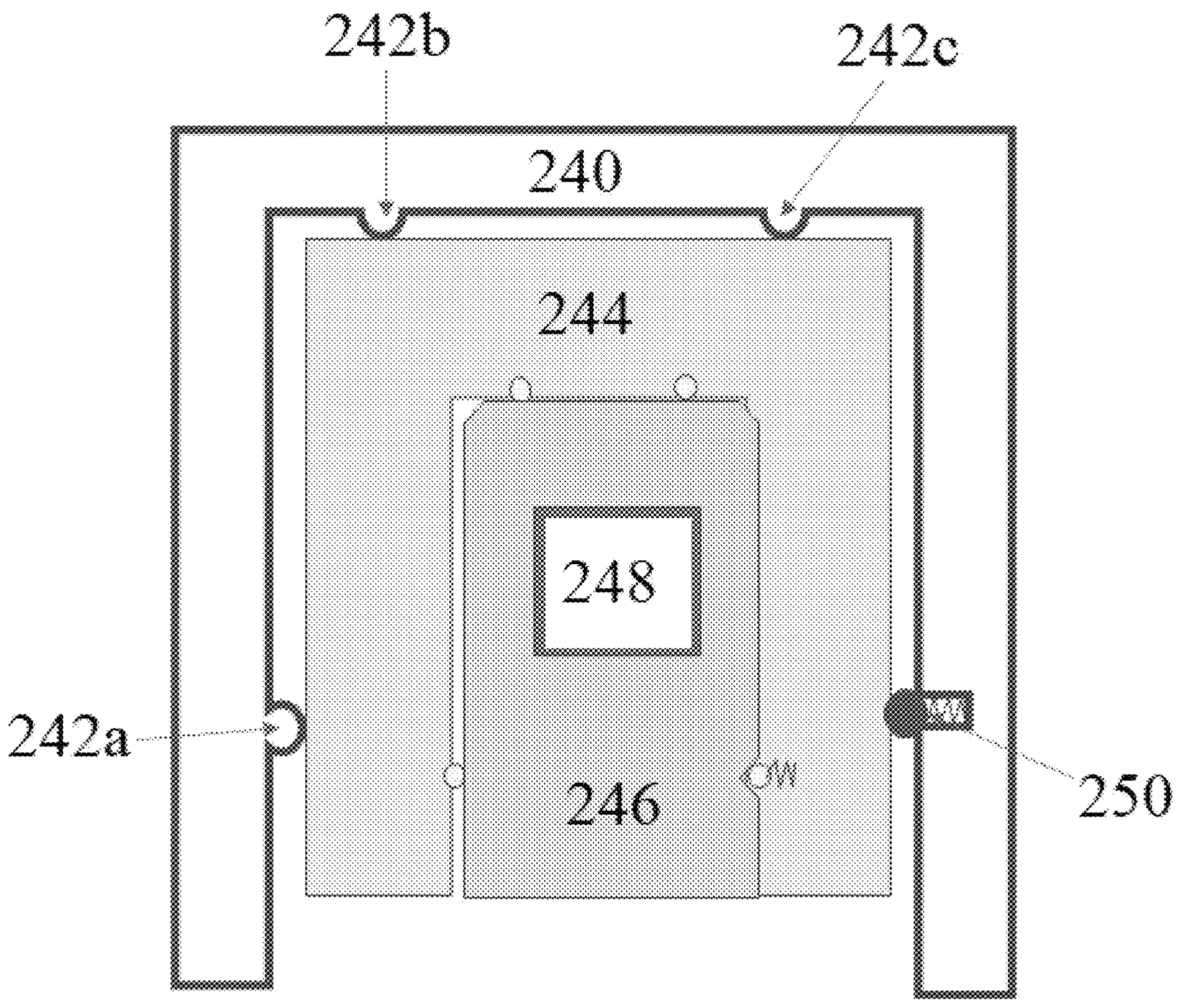
FIG. 14 schematically shows a different design of sliding specimen table and specimen holder in accordance with an exemplary embodiment of the present invention.

In some other embodiments of the invention as shown in FIG. 14, sliding specimen table 244 and specimen holder 246 may have a design that is different from those described above. Like FIG. 4, specimen table 244 in FIG. 14 may also be U-shaped, and may also include a base 243*a*, a right arm 243*b* and a left arm 243*c* that are extended from the base 243*a*. An open space 243*d* is thus formed by the base 243*a* and the two arms 243*b* and 243*c*. The open space 243*d* has a mouth 243*m*.

However, unlike FIG. 4, it is the base 243*a* (rather than mouth 243*m*) that will contact permanent protrusions 242*b* and 242*c*. Side zone 245*a* is thus optional in FIG. 14. When side zone 245*a* is not present, left arm 243*c* itself will directly contact ball 250. Moreover, one or both of the ends of right arm 243*b* and left arm 243*c* that are distal from the base 243*a* may be flat, and may not necessarily be tapered, since they are not needed for facilitating the entry of the specimen table 244 into the receptacle 241. Instead, base 243*a* can be tapered for facilitating the entry of the specimen table 244 into the receptacle 241.

Unlike FIG. 5, specimen holder 246 in FIG. 14 is not placed on or above the specimen table 244 and is therefore not spanned over open space 243*d*. Instead, specimen holder 246 in FIG. 14 will be inserted into open space 243*d*. Like FIG. 5, a specimen or a sample 248 can be placed on specimen holder 246 for microscope examination.

As an alternative to, or in addition to, three permanent protrusions 242*a*, 242*b* and 242*c*, and one elastic protrusion 251 including ball 250 attached to spring 252 as described and illustrated above, specimen table 244 may have three same or similar permanent protrusions and one elastic protrusion same or similar around specimen holder 246.

In the foregoing specification, embodiments of the present invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicant to be the scope of the invention, is the literal and equivalent scope of the set of claims that issue from this application, in the specific form in which such claims issue, including any subsequent correction.

The invention claimed is:

1. An apparatus of charged-particle beam such as an electron microscope comprising an objective lens, a specimen table, and a specimen stage having an empty space as a receptacle for accommodating the specimen table;

wherein the objective lens has a planar surface configured for the specimen table to sit on and slide on;

wherein the specimen table can be placed into, and removed away, from the receptacle;

wherein the specimen stage comprises an elastic protrusion and one or more elastic force receiving parts surrounding the receptacle such as a side wall opposite to the elastic protrusion, a side wall neighboring the elastic protrusion, and/or protrusion(s) on the side wall opposite to the elastic protrusion and/or the side wall neighboring the elastic protrusion, wherein the elastic protrusion is configured to push or press the specimen table against said one or more elastic force receiving parts of the specimen stage after the specimen table is placed into the receptacle, so that the orientation and the position of the specimen table is fixed relative to the specimen stage, wherein the specimen stage can move the specimen table by sliding it to a plurality of predetermined positions on said planar surface of the objective lens, and to hold the specimen table on each of the predetermined positions for a period of examination time, and wherein, when a disturbing vibration between the objective lens and the specimen stage occurs during said period of examination time, the elastic protrusion will absorb the disturbing vibration to an effect that the specimen table remains stationary relative to the objective lens.

2. The apparatus of charged-particle beam according to claim 1, wherein said one or more elastic force receiving parts of the specimen stage comprise three permanent protrusions on the side wall opposite to the elastic protrusion and/or the side wall neighboring the elastic protrusion, wherein the three permanent protrusions and the elastic protrusion surround the receptacle, and any three protrusions of said four protrusions are not arranged in a linear relationship;

wherein the elastic protrusion is configured to push or press the specimen table against the three permanent protrusions after the specimen table is placed in the receptacle, so that the orientation and the position of the specimen table is fixed relative to the specimen stage.

3. The apparatus of charged-particle beam according to claim 2, further comprising a specimen holder on said specimen table, on which a specimen can be placed for microscope examination.

4. The apparatus of charged-particle beam according to claim 2, wherein the planar surface is a surface around the lower pole piece of the objective lens.

5. The apparatus of charged-particle beam according to claim 2, wherein the specimen table is U-shaped, and includes a base, a right arm and a left arm that are extended from the base, and an open space formed by the base and the two arms.

6. The apparatus of charged-particle beam according to claim 5, wherein the specimen table incudes four side zones for contacting the four protrusions, and at least two of the side zones are flat or planar.

7. The apparatus of charged-particle beam according to claim 6, wherein one or both of the ends of the right aim and the left arm that are distal from the base are tapered for facilitating the entry of the specimen table into the receptacle.

8. The apparatus of charged-particle beam according to claim 7, wherein the end of the base that is distal from the arms is tapered for facilitating the retreat of the specimen table from the receptacle.

9. The apparatus of charged-particle beam according to claim 8, wherein all the four side zones are flat or planar, and any three of the four side zones are not parallel to each other.

10. The apparatus of charged-particle beam according to claim 9, wherein the side zone for contacting the elastic protrusion is not in parallel with any other side zone(s), and is not perpendicular to any other side zone either.

11. The apparatus of charged-particle beam according to claim 10, wherein the side zone for contacting the elastic protrusion also functions as a tapered structure of the base.

12. The apparatus of charged-particle beam according to claim 2, wherein the elastic protrusion includes a ball attached to a spring, and the three permanent protrusions are dome-shaped.

13. The apparatus of charged-particle beam according to claim 12, wherein the ball and the three permanent protrusions are made of a non-magnetic material such as ceramic material, non-ferrous metals such as aluminum, copper, lead, nickel, tin, titanium and zinc, and non-ferrous alloys such as beryllium copper (BeCu).

14. The apparatus of charged-particle beam according to claim 13, wherein the elastic protrusion and a front permanent protrusion function as a flexible gate structure to admit the specimen table snap into the receptacle.

15. The apparatus of charged-particle beam according to claim 1, wherein said disturbing vibration is a mechanical oscillation that occurs about one of the predetermined positions as the equilibrium point.

16. The apparatus of charged-particle beam according to claim 1, wherein said disturbing vibration has an amplitude of less than 1 nm, and the sliding has a shortest sliding distance of greater than 1 μm.

17. The apparatus of charged-particle beam according to claim 16, wherein said disturbing vibration deforms or compresses at least some of the four protrusions, and an elastic force of equal magnitude and opposite direction is generated from the deformation or compression; and wherein the elastic force is weaker than, and therefore cannot overcome, the limiting friction between the specimen table and the planar surface of the objective lens.

18. The apparatus of charged-particle beam according to claim 16, wherein the sliding can overcome the limiting friction between the specimen table and the planar surface of the objective lens.

19. The apparatus of charged-particle beam according to claim 1, wherein the limiting friction between the specimen table and the planar surface of the objective lens is a function of the weight of specimen table, the size of specimen table's bottom surface that contacts planar surface, surface properties of specimen table's bottom surface, and surface properties of planar surface.

20. The apparatus of charged-particle beam according to claim 1, which is an electron microscope such as a scanning transmission electron microscope (STEM), a scanning electron microscope (SEM), or a transmission electron microscope (TEM).

* * * * *